United States Patent
Chen et al.

(10) Patent No.: US 10,622,278 B2
(45) Date of Patent: Apr. 14, 2020

(54) SEMICONDUCTOR STRUCTURE AND ASSOCIATED METHOD FOR MANUFACTURING THE SAME

(71) Applicant: TAIWAN SEMICONDUCTOR MANUFACTURING COMPANY LTD., Hsinchu (TW)

(72) Inventors: Chin-Liang Chen, Kaohsiung (TW); Chi-Yang Yu, Taoyuan County (TW); Kuan-Lin Ho, Hsinchu (TW); Yu-Min Liang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/380,197

(22) Filed: Apr. 10, 2019

(65) Prior Publication Data

US 2019/0237385 A1 Aug. 1, 2019

Related U.S. Application Data

(60) Continuation of application No. 15/943,047, filed on Apr. 2, 2018, now Pat. No. 10,269,679, which is a
(Continued)

(51) Int. Cl.
*H01L 21/00* (2006.01)
*H01L 23/373* (2006.01)
(Continued)

(52) U.S. Cl.
CPC ...... *H01L 23/3736* (2013.01); *H01L 21/4846* (2013.01); *H01L 21/561* (2013.01);
(Continued)

(58) Field of Classification Search
CPC ..... H01L 23/3736; H01L 24/32; H01L 24/83; H01L 24/97
See application file for complete search history.

(56) References Cited

U.S. PATENT DOCUMENTS 6,104,093 A  8/2000  Caletka et al.
7,605,477 B2 * 10/2009  Wong ............... H01L 21/563
                                              257/777
(Continued)

FOREIGN PATENT DOCUMENTS

CN          104835745 A      8/2015

OTHER PUBLICATIONS

Office action dated Feb. 6, 2020 for corresponding China application 201710454238.5.

*Primary Examiner* — Nicholas J Tobergte
(74) *Attorney, Agent, or Firm* — WPAT, P.C., Intellectual Property Attorneys; Anthony King

(57) ABSTRACT

A method for manufacturing a semiconductor structure is disclosed. The method includes: providing a semiconductor substrate having a plurality of dies thereon; dispensing an underfill material and a molding compound to fill spaces beneath and between the dies; disposing a temporary carrier over the dies; thinning a thickness of the semiconductor substrate; performing back side metallization upon the thinned semiconductor substrate; removing the temporary carrier; and attaching a plate over the dies. An associated semiconductor structure is also disclosed.

20 Claims, 11 Drawing Sheets

Related U.S. Application Data division of application No. 15/228,746, filed on Aug. 4, 2016, now Pat. No. 9,941,186.

(60) Provisional application No. 62/357,100, filed on Jun. 30, 2016.

(51) Int. Cl.

| | | |
|---|---|---|
| *H01L 23/31* | (2006.01) | |
| *H01L 23/36* | (2006.01) | |
| *H01L 21/48* | (2006.01) | |
| *H01L 23/538* | (2006.01) | |
| *H01L 21/56* | (2006.01) | |
| *H01L 21/683* | (2006.01) | |
| *H01L 21/78* | (2006.01) | |
| *H01L 23/00* | (2006.01) | |
| *H01L 23/498* | (2006.01) | |
| *H01L 23/14* | (2006.01) | |

(52) U.S. Cl.
CPC .......... *H01L 21/563* (2013.01); *H01L 21/565* (2013.01); *H01L 21/6835* (2013.01); *H01L 21/78* (2013.01); *H01L 23/3128* (2013.01); *H01L 23/36* (2013.01); *H01L 23/3731* (2013.01); *H01L 23/5383* (2013.01); *H01L 24/32* (2013.01); *H01L 24/83* (2013.01); *H01L 24/97* (2013.01); *H01L 23/147* (2013.01); *H01L 23/49816* (2013.01); *H01L 24/16* (2013.01); *H01L 24/73* (2013.01); *H01L 2221/68327* (2013.01); *H01L 2221/68359* (2013.01); *H01L 2224/131* (2013.01); *H01L 2224/13147* (2013.01); *H01L 2224/16225* (2013.01); *H01L 2224/16238* (2013.01); *H01L 2224/29099* (2013.01); *H01L 2224/32225* (2013.01); *H01L 2224/32245* (2013.01); *H01L 2224/73204* (2013.01); *H01L 2224/73253* (2013.01); *H01L 2224/97* (2013.01); *H01L 2924/18161* (2013.01); *H01L 2924/3511* (2013.01)

(56) References Cited

U.S. PATENT DOCUMENTS

| | | | |
|---|---|---|---|
| 8,441,120 | B1 | 5/2013 | Arcedera et al. |
| 8,907,471 | B2 * | 12/2014 | Beyne ................. H01L 23/3128 257/687 |
| 2002/0109218 | A1 * | 8/2002 | Akram ................. H01L 21/563 257/697 |
| 2013/0217188 | A1 | 8/2013 | Wang et al. |
| 2015/0069596 | A1 * | 3/2015 | Kawasaki ............ H01L 23/367 257/712 |

* cited by examiner

SEMICONDUCTOR STRUCTURE AND ASSOCIATED METHOD FOR MANUFACTURING THE SAME

PRIORITY CLAIM AND CROSS-REFERENCE

This application is a continuation of application Ser. No. 15/943,047, filed on Apr. 2, 2018, which is a division of application Ser. No. 15/228,746, filed on Aug. 4, 2016, which claims the benefit of U.S. provisional application 62/357,100, filed on Jun. 30, 2016. All of the above-referenced applications are hereby incorporated herein by reference in their entirety.

BACKGROUND

In the field of electronic packaging, a molding process and a wafer thinning process are required after a chip-on-wafer (CoW) assembly. Some factors such as size, chip height uniformity, chip distribution uniformity, hardness, rigidity, coefficient of thermal expansion and glass transition temperature of the molding material and chips, warpage of the wafer and warping uniformity influence the product yield.

It has been found that serious warping easily occurs to a molding package during a reflow process and consequently to cause non-contact or separation between a CoW and a substrate. Therefore, how to overcome the above-described drawbacks has become critical.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
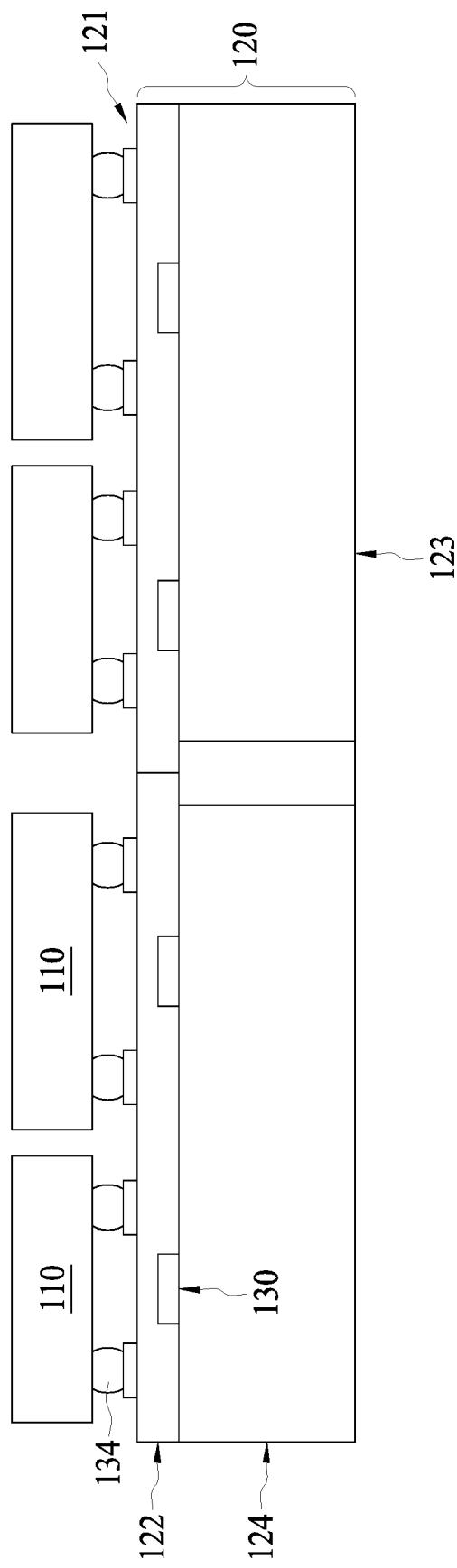
FIGS. 1 to 9 are cross-sectional views of intermediate stages in the manufacturing of a semiconductor structure in accordance with exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An exemplary method for forming a semiconductor structure 100 according to the present disclosure will now be described. FIGS. 1-8 illustrate cross-sections of a semiconductor structure 100 during sequential fabrication steps. In one embodiment, the semiconductor substrate may be a silicon interposer, which may form part of a 3D IC chip package.

Referring to FIG. 1, the process for forming a semiconductor structure begins by providing a semiconductor substrate 120 having a plurality of chips or dies 110 already mounted previously thereon (also known as a CoW or chip-on-wafer). Accordingly, in some embodiments, the dies 110 may be regarded as top dies. The substrate 120 may be an interposer which may be formed of any suitable material without a limitation, such as silicon, glass-silicon, or other substrate material used in the semiconductor art. In one embodiment, the substrate 120 is a silicon interposer and the interposer may be a silicon wafer. The substrate 120 has not been thinned at this point in the fabrication process. The substrate 120 may have a total thickness greater than about 100 microns before thinning. However, this is not a limitation of the present disclosure. In some embodiments, the substrate 120 may have a total thickness of about 25 microns thick. Please note that details regarding the substrate 120 may be omitted and not depicted in FIG. 1 for brevity.

Referring to FIG. 1, the substrate 120 includes an upper portion 122 bounded by a top (front) side or a surface 121 facing the dies 110. The substrate 120 further includes a lower portion 124 bounded by an opposite bottom (back) side or surface 123. The upper portion 122 is proximate to the dies 110 and the lower portion 124 is distal to the dies 110. The upper portion 122 of the substrate 120 may include the front side metallization including a conductive redistribution layer (RDL) interconnection structure 130 which are known in the art and may include a combination of variously configured conductive pads, leads, vias, and trenches for forming electrical circuits that conductively connect groups of the dies 110 which are shown in FIG. 1 and also form conductive pathways vertically through the upper portion 122. In some embodiments, the substrate 120 may include TSVs (not shown in FIG. 1 for brevity) coupled to the RDL interconnection structure 130.

The dies 110 are conductively coupled to the substrate 120 by a plurality of micro-bumps 134 formed between the dies 110 and the substrate 120 as shown in FIG. 1. The micro-bumps 134 may be made of any suitable conductive material, including copper or copper-tin. In one exemplary embodiment, without limitation, the micro-bumps 134 may be solder bumps having a diameter of about 20 microns with pitch spacing of about 50 microns or less consistent with 3D IC chip package construction. The micro-bumps 134 may be joined to the upper portion 122 of the substrate 120 by any suitable process, such as without limitation solder reflow.

In some embodiments, the upper portion 122 of the substrate 120 may further include integrated passive devices (IPD) in addition to front side RDL interconnection structure 130. The IPDs may include components such as resistors, capacitors, resonators, filters, or other components commonly found in RF circuitry.

In some embodiments, without limitation, the RDL interconnection structure 130 in the upper portion 122 of the substrate 120 may be formed by back-end-of-line (BEOL) processes commonly used in the art for forming interconnects including damascene and dual damascene processes using a combination of photolithography using patterned photoresist, etching, and conductive material or metal deposition and plating operations. Formation of the front side RDL interconnection structure in the upper portion 122 of the substrate 120 precedes mounting the dies 110 on the substrate.

With continuing reference to FIG. 1, the lower portion 124 of the substrate 120 at this point in the fabrication process prior to substrate thinning may be a solid monolithic piece of material without any metallization such as internal conductive structures or through-silicon vias (TSVs) yet formed.

Figure 2:
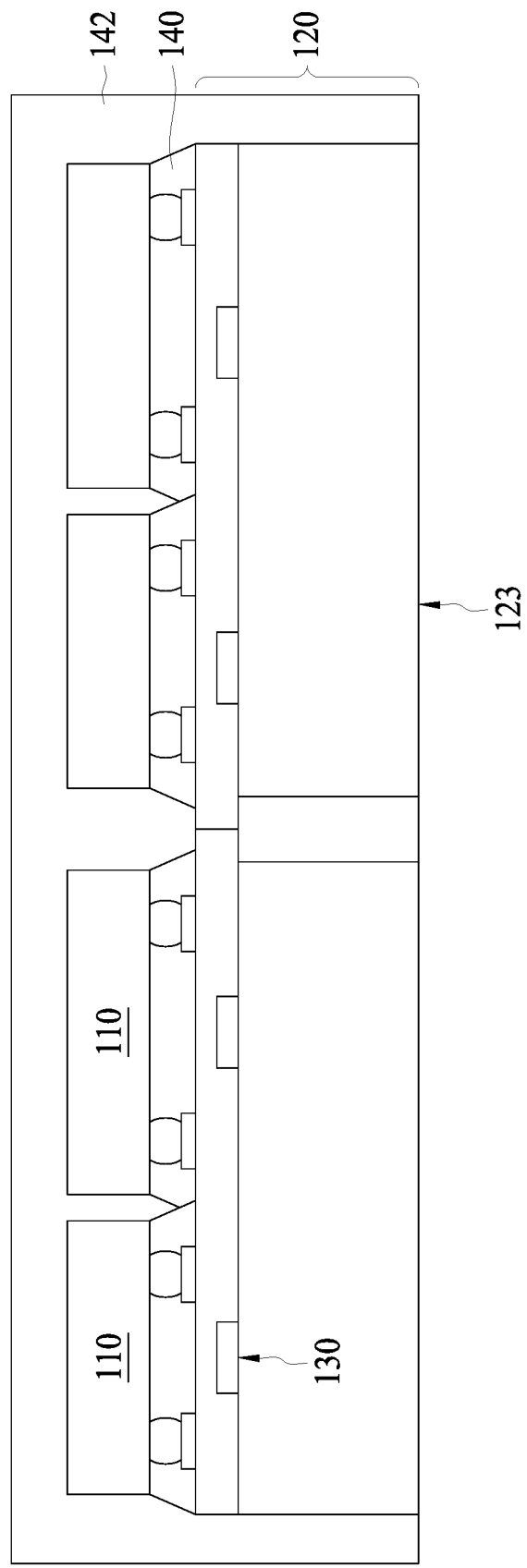

In FIG. 2, the semiconductor structure fabrication process continues with an underfill and over-molding process in which an underfill material 140 and a molding compound 142 are dispensed or injected to fill the interstitial spaces (shown in FIG. 1) beneath the dies 110 and between adjacent dies. The molding compound 142 is then cured such as by the application of heat or UV radiation for a period of time to harden the compound. The molding compound 142 may be slightly over-molded to extend above the dies 110 as shown to ensure that the dies 110 are completely encapsulated. The molding compound 142 and the underfill material 140 protect and structurally support the dies 110 and the micro-bump 134. Any suitable kind of commercially-available epoxy or polymer-based molding material or encapsulant used for semiconductor fabrication may be used.

In the exemplary embodiments, a two-step molding process may be used wherein the underfill material 140 is first injected beneath the dies 110 (i.e. between dies and the substrate 120) followed by over-molding with a second molding material to encapsulate and fill the spaces between the dies so as to form the molding compound 142. The underfill material may be any suitable liquid epoxy, deformable gel, silicon rubber, or other material used for underfilling compounds.

Figure 3:
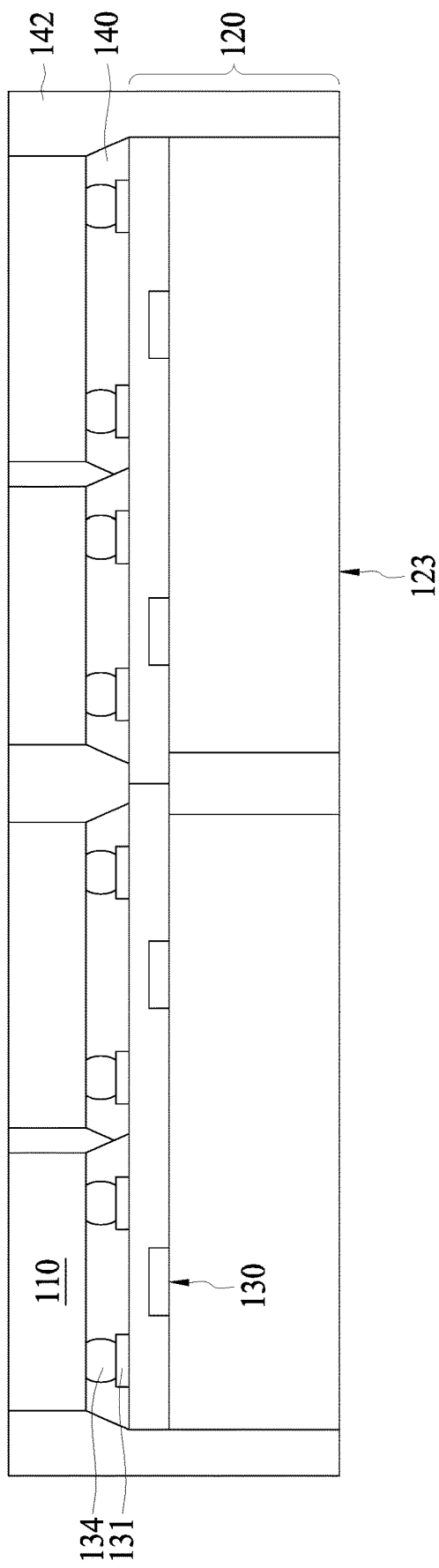

In FIG. 3, after the molding compound 142 is cured and hardened, fabrication of the semiconductor structure continues with a planarization process for removing the overburden or excess molding compound 142 to expose the top of the dies 110 as shown. Planarization may be performed by any suitable mechanical and/or chemical-mechanical means used in the art to remove the excess molding compound 142. In some embodiments, the molding compound 142 may be removed by chemical mechanical planarization (CMP), grinding with a grit wheel, or other techniques. This planarization process may also back lap some of the dies 110 since the dies 110 may not all be of uniform thickness or height. The resulting top surface of the dies 110 and the molding compound 142 is intended to be relatively planar, as shown in FIG. 3.

Figure 4A:
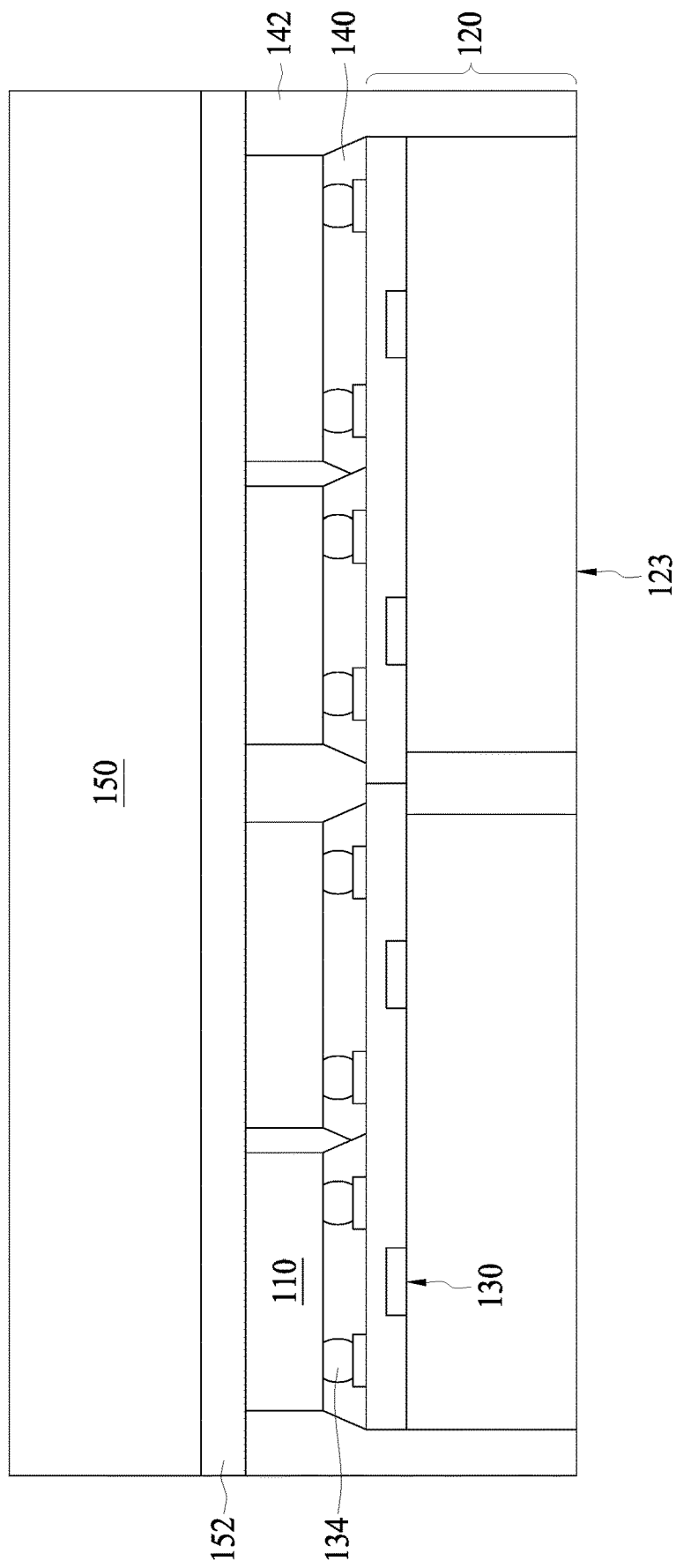

Referring now to FIG. 4A, a temporary carrier 150 (also referred to as "handle" in the art) is next attached and bonded to the top of dies 110 to facilitate handling the semiconductor structure 100 and supporting the substrate 120 during further fabrication steps. In some embodiments, the carrier 150 may be made of glass, silicon oxide, aluminum oxide, or other suitable materials. In one embodiment, the carrier 150 may be glass. The carrier 150 may be provided with a releasable adhesive 152 for temporarily bonding the carrier 150 to the CoW structure during processing and then to facilitate easy removal of the carrier 150 from the semiconductor structure. Any suitable type of commercially-available releasable adhesive may be used. In some embodiments, a thermal interface material (TIM) may be used for temporarily bonding the carrier to the CoW structure.

Figure 5A:
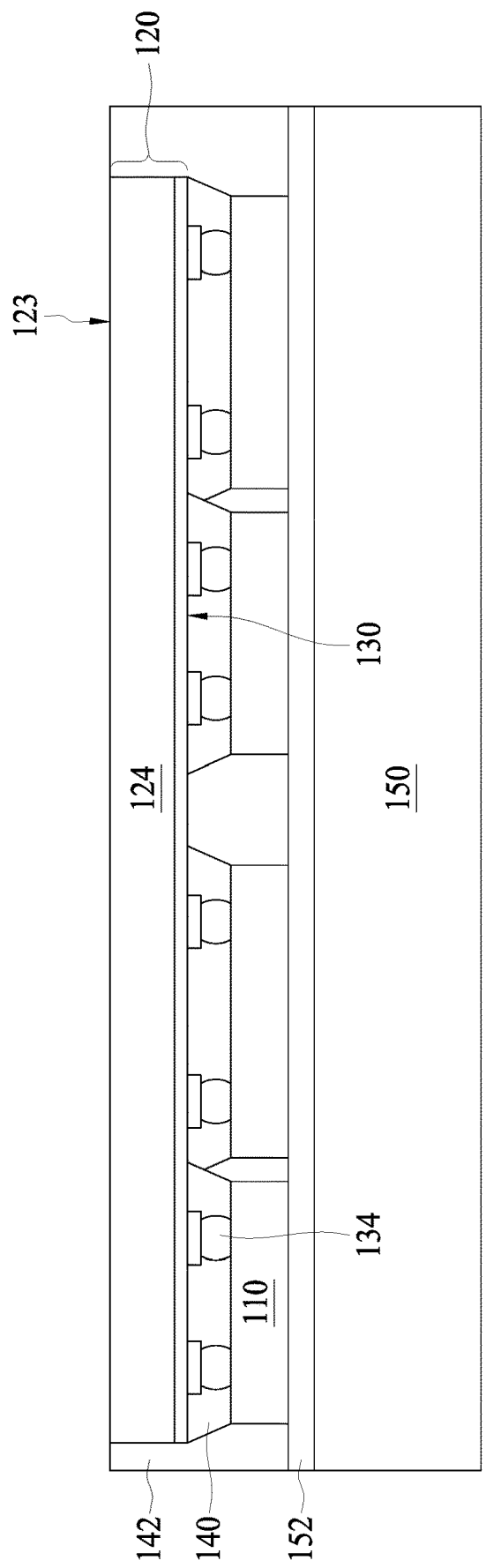
Figure 5B:
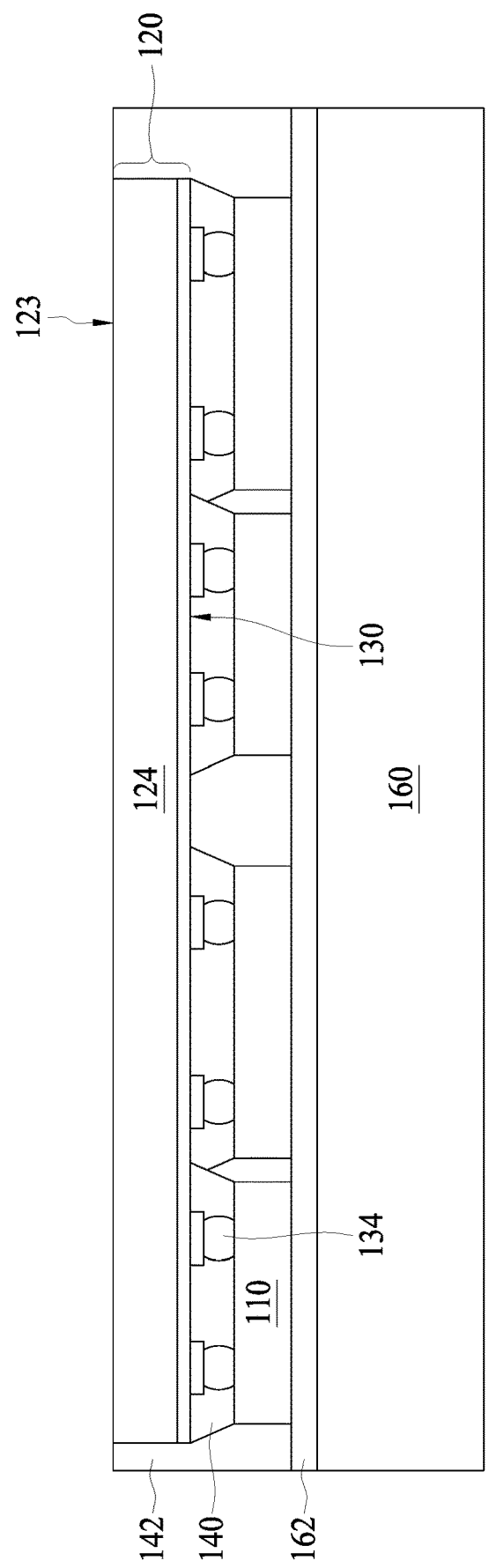

In the next step shown in FIG. 5A, a thinning operation is now performed to reduce the thickness of the substrate 120, which in this non-limiting embodiment may be silicon. The semiconductor structure of FIG. 4A may first be inverted for the silicon thinning step as shown.

With continuing reference to FIG. 5A, the silicon thinning operation may be performed by any suitable mechanical or chemical-mechanical process used in the art. In some embodiments, thinning may be performed by grinding using a grinding machine having a scroll plate or wheel with appropriately sized abrasive or grit particles adhered to the wheel. In some embodiments, grit particles may be made of diamond.

In one embodiment, a two-stage grinding process may be used to reduce the thickness of the silicon substrate 120. A first rough grinding step may first be performed on the substrate 120 using large coarse grit material, such as a 40-60 micron size abrasive. A second final grinding step may be subsequently performed on substrate 120 using a fine grit material, such as a 10-30 micron size abrasive material. The second fine grinding step produces a relatively smooth or polished and planar bottom surface 123 (shown inverted in FIG. 5A). Alternatively, chemical mechanical planning (CMP) may optionally be used for the second fine grinding step or in addition to the second grinding step thereafter to polish the bottom surface 123 of the substrate 120. The second thickness of the silicon substrate 120 after the thinning operation is less than the first thickness shown in FIG. 1. In some exemplary embodiments, without limitation, the substrate 120 after thinning may have a thickness of about 0.8 to 1 mm. The reduction in substrate thickness advantageously permits a thinner die package to be formed which consumes less vertical height thereby creating a smaller form factor for the die package.

It should be noted that the substrate thinning operation removes silicon material from lower portion 124 of the substrate 120 and does not interfere with or damage the RDL interconnection structure 130 existing in upper portion 122. In one embodiment, the thinning operation is performed until the conductive front side RDL contact pads, vias, TSVs or other conductive structures already formed in upper portion 122 of substrate 120 are revealed or exposed. In some embodiments, the lower portion 124 of substrate 120 may contain primarily TSVs (not shown in FIG. 5A for brevity). The upper ends of the TSVs may be conductively coupled or connected to any type or combination of conductive contacts in upper portion 122 of the substrate 120 that form part of front side metallization and RDL interconnects 130 including without limitation TSV-to-partial through vias and/or TSV-to-conductive pads or horizontal leads.

Figure 6:
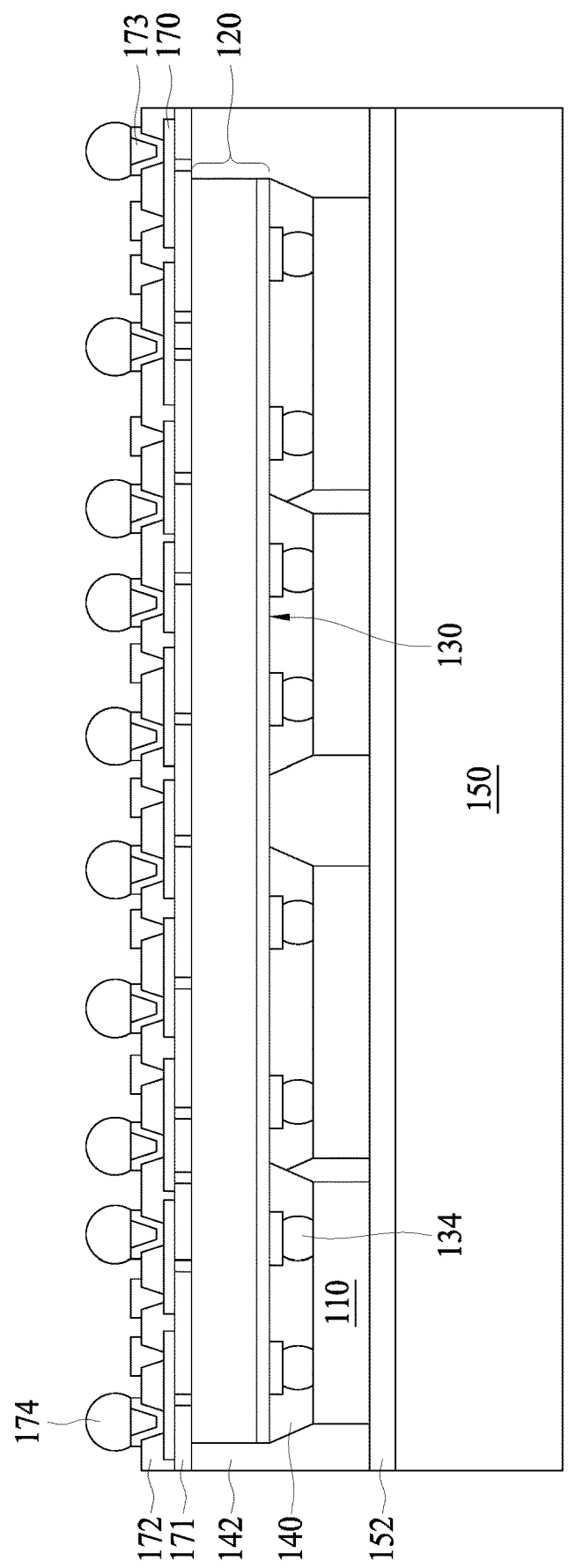

Referring to FIG. 6, back side metallization may next be performed to build RDL interconnects 170 for completing the C4 (i.e. controlled collapse chip connections) or "flip chip" die package which may ultimately be mounted on a system board such as a PCB (printed circuit board). The back side metallization includes formation of the conductive redistribution layer (RDL) interconnects 170 as commonly known to those in the art that may include a combination of conductive pads, leads, vias, trenches, and bumps. This final metallization stage may include first depositing a first dielectric passivation layer 171 on bottom surface 123 of semiconductor substrate 120. The passivation layer 171 is next patterned using photolithography, and then subsequently etched to create openings that expose the ends of TSVs to permit the back side RDL metallization to make electrical connections to the TSVs. A second dielectric layer 172 may be deposited on the passivation layer 171. The back side RDL interconnects 170 are next formed in the dielectric layer 172 including an array of C4 bumps 174 on UBM pads 173. The bumps 174 may be made of any suitable material commonly used for C4 bumps and may be formed by any suitable process known in the art for fabricating flip chip connections. In some embodiments, the bumps 174 may be made of Cu. The bumps 174 may have wider pitch spacing than micro-bumps 134 and on the order of about 150-200 microns in some embodiments.

Figure 7:
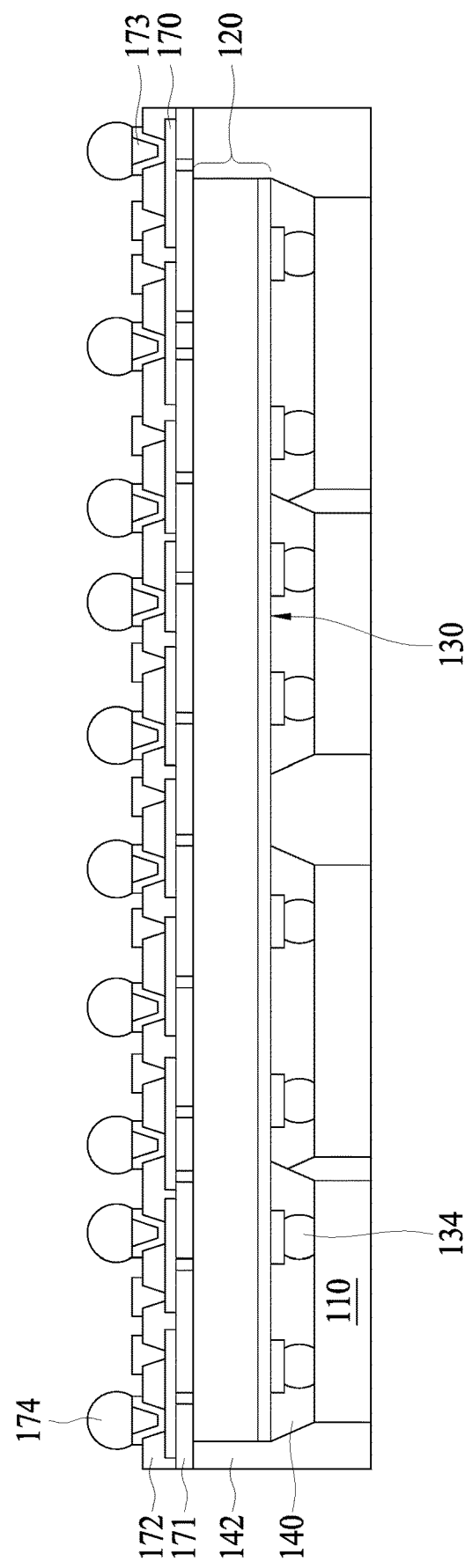
Figure 8:
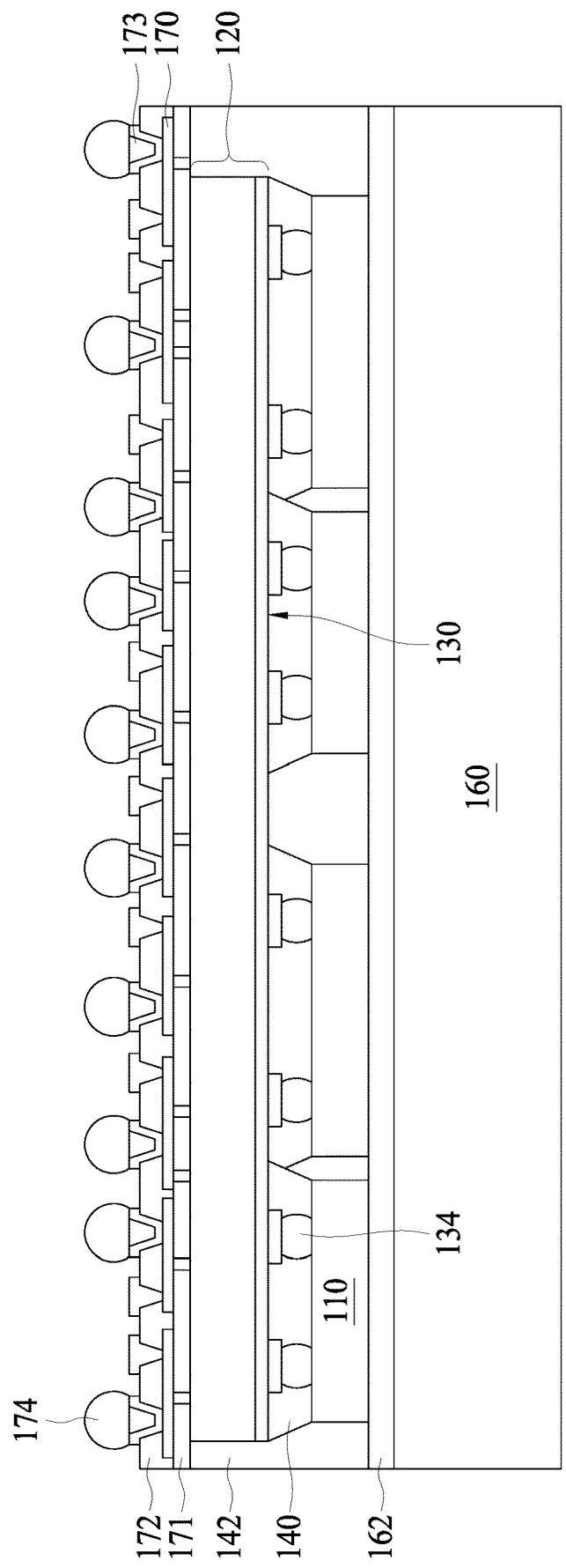

After formation of the back side RDL interconnects 170 and C4 bump array 174 as shown in FIG. 6, the temporary carrier 150 is released and removed from the dies 110 by any suitable manner as shown in FIG. 7. A suitable cleaning process may be used to remove any residual adhesive from the top surfaces of the dies 110 and molding compound 142 filling the interstitial spaces between the dies. Referring now to FIG. 8, a plate 160 (also referred to as "lid" in the art) is next attached and bonded to the top of the CoW structure including the dies 110 and the molding compound 142. Generally, the plate 160 has a rigidity greater than that of the CoW structure so as to reduce warpage of the CoW structure. In some embodiments, the plate 160 may include material such as metal. In some embodiments, the plate 160 may include Cu having a modulus from about 130 to about 118 GPa. In some embodiments, the plate 160 may include stainless steel having a modulus from about 190 to about 203 GPa. In some embodiments, the plate 160 may include ceramic material having a modulus from about 100 to about 175 GPa. However, this is not a limitation of the present disclosure. In some embodiments, the plate 160 may have a thickness of about 0.5 mm to about 2 mm.

Please note that the plate 160 may be used as a heat spreader to replace a lid that conventionally formed after performing die saw on the wafer. The plate 160 may be provided with an adhesive 162 uniformly applied for bonding the plate 160 to the CoW structure. Any suitable type of commercially-available adhesive may be used. In some embodiments, a TIM may be used for bonding the carrier to the semiconductor die structure. In some embodiments, the adhesive 162 may have a thickness of about 50 microns to about 150 microns.

Figure 9:
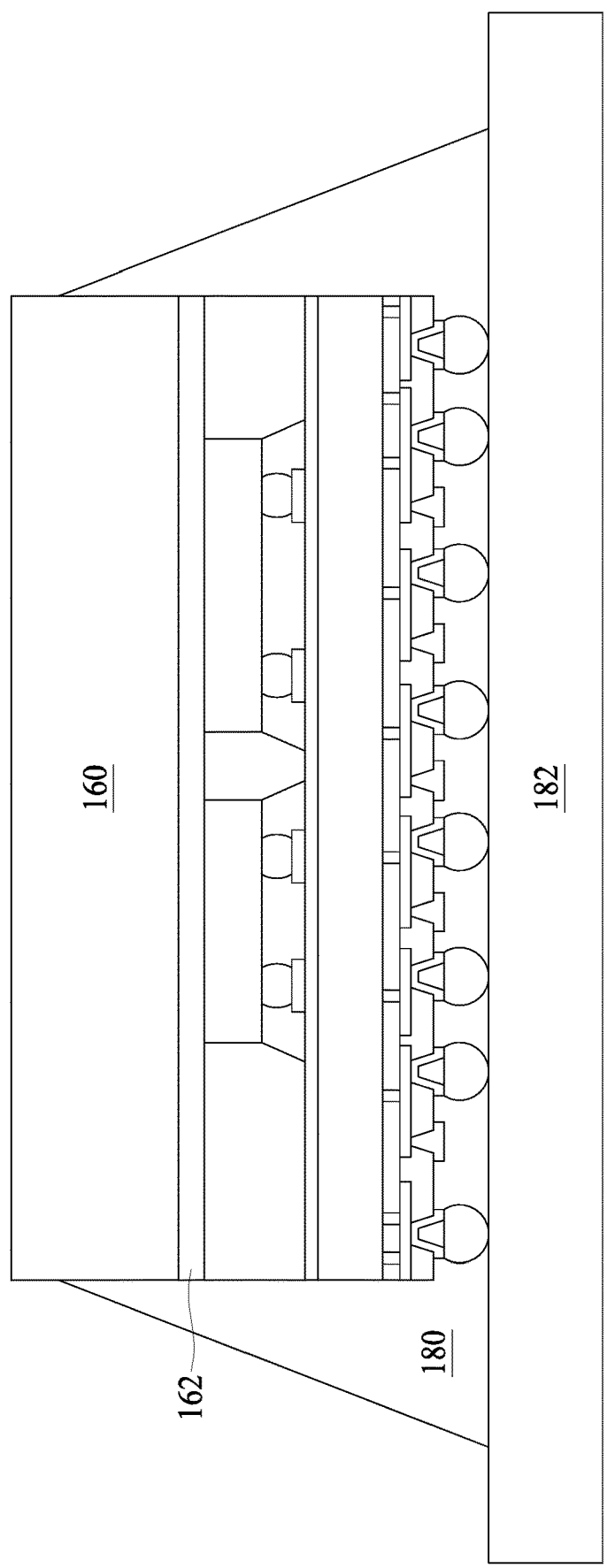

In the next step shown in FIG. 9, the CoW structure and the attached plate 160 of FIG. 8 are sawed and mounted on a substrate 182, such as a circuit board. An underfill material 180 is dispensed into gaps between the sawed CoW structure and the substrate 182. Since the plate 160 is bonded to the CoW structure before sawed, the edge of the plate 160 and the adhesive 162 are able to be flush with the edge of the CoW structure without extrusion. In the exemplary embodiment, the underfill material 180 may cover at least a portion of the plate 160. However, this is not a limitation of the present disclosure. In the exemplary embodiment, the underfill material 180 may at most cover to the adhesive 162 or the CoW structure.

Figure 4B:
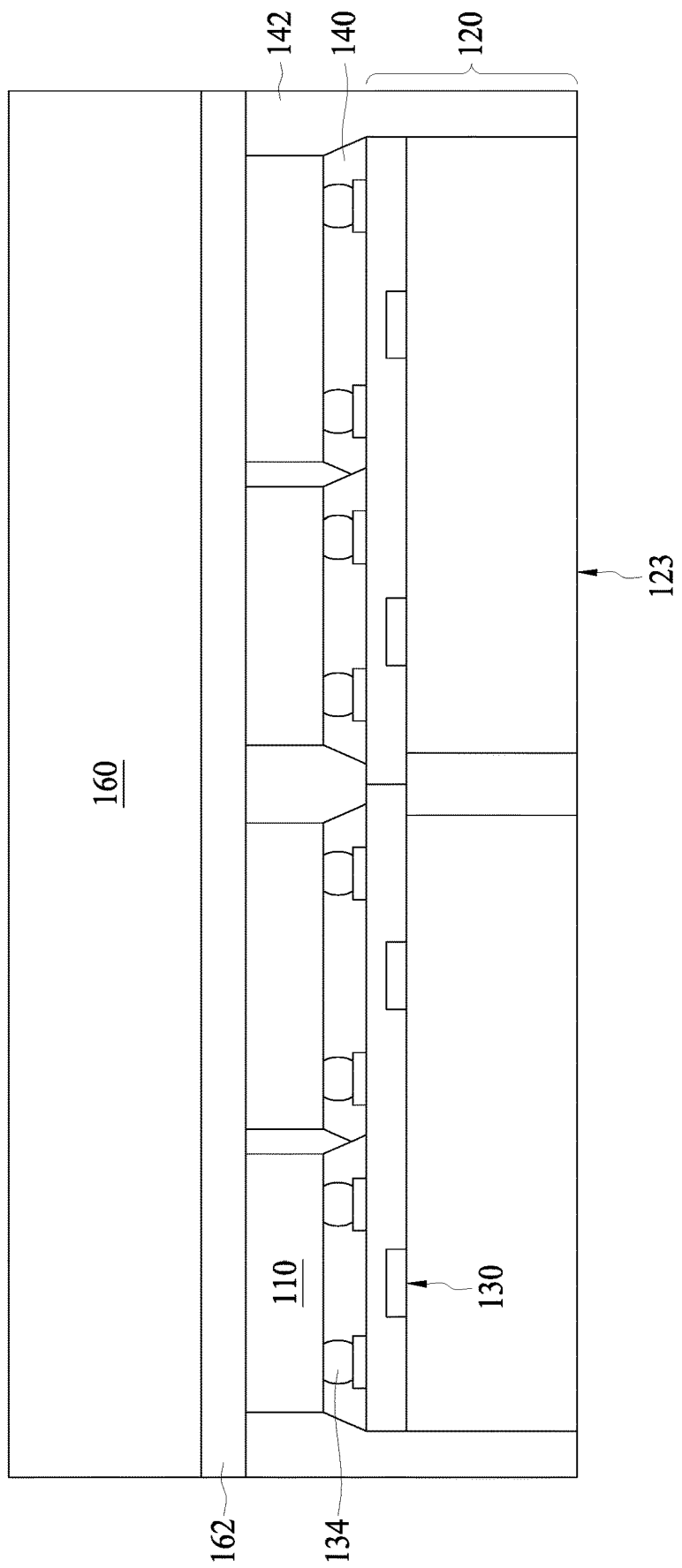

In another exemplary embodiment, the process of attaching a plate is shifted to an earlier phase. In particular, the plate is employed to replace the temporary carrier 150 during the process of FIG. 4A. As shown in FIG. 4B, the plate 160 is attached and bonded to the top of dies 110 by the adhesive 162 to support the substrate 120 during further fabrication steps and mitigate warpage of the CoW structure. In the next step shown in FIG. 5B, a thinning operation is performed to reduce the thickness of the substrate 120, which in this non-limiting embodiment may be silicon. Thereafter, back side metallization may be performed for completing the C4 or "flip chip" die package and the post-OS operation as shown in FIGS. 8 to 9.

Some embodiments of the present disclosure provide a method for manufacturing a semiconductor structure, including: providing a semiconductor substrate having a plurality of dies thereon; dispensing an underfill material and a molding compound to fill spaces beneath and between the dies; disposing a temporary carrier over the dies; thinning a thickness of the semiconductor substrate; performing back side metallization upon the thinned semiconductor substrate; removing the temporary carrier; and attaching a plate over the dies.

Some embodiments of the present disclosure provide a method for manufacturing a semiconductor structure, including: providing a semiconductor substrate having a plurality of dies thereon; dispensing an underfill material and a molding compound to fill spaces beneath and between the dies; attaching a plate over the dies; thinning a thickness of the semiconductor substrate; performing back side metallization upon the thinned semiconductor substrate; and sawing the semiconductor substrate including the plate.

Some embodiments of the present disclosure provide a semiconductor structure, including: a chip-on-wafer (CoW) assembly including a semiconductor substrate and a plurality of dies on the semiconductor substrate; a plate attached over a first side of the CoW assembly; and an adhesive used to bonding the plate and the CoW assembly; wherein edges of the adhesive are flush with edges of the CoW assembly.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a semiconductor substrate having a front side and a back side opposite to the front side;
   a plurality of dies on the front side of the semiconductor substrate;
   a plate attached over the plurality of dies, wherein the plurality of dies is between the plate and the semiconductor substrate;
   an adhesive used to bonding the plate and the plurality of dies; and
   an underfill material covering at least a portion of a sidewall of the plate.

2. The semiconductor structure of claim 1, wherein edges of the plate are flush with edges of the semiconductor substrate.

3. The semiconductor structure of claim 2, further comprising a metallization layer on the back side of the semiconductor substrate.

4. The semiconductor structure of claim 3, further comprising a molding compound filling space between the metallization layer and the adhesive.

5. The semiconductor structure of claim 4, wherein the edges of the adhesive are flush with edges of the molding compound.

6. The semiconductor structure of claim 1, wherein the plate includes a Cu plate.

7. The semiconductor structure of claim 1, wherein the plate includes a stainless steel plate.

8. The semiconductor structure of claim 1, wherein the plate includes a ceramic plate.

9. The semiconductor structure of claim 1, wherein the adhesive has a thickness of about 50 microns to about 150 microns.

10. A semiconductor structure, comprising:
    a first semiconductor substrate having a front side and a back side opposite to the front side;
    a plurality of dies on the front side of the first semiconductor substrate;
    a plate attached over the plurality of dies, wherein the plurality of dies is between the plate and the first semiconductor substrate;
    a molding compound filling space between the first semiconductor substrate and the plate;
    a second semiconductor substrate, wherein the back side of the first semiconductor substrate is bonded to the second semiconductor substrate; and
    an underfill material filling space between the first semiconductor substrate and the second semiconductor substrate, the underfill material covering at least a portion of the plate.

11. The semiconductor structure of claim 10, further comprising an adhesive used to attaching the plate to the plurality of dies and the molding compound.

12. The semiconductor structure of claim 10, wherein the plate includes a metal.

13. The semiconductor structure of claim 12, wherein the plate includes Cu.

14. The semiconductor structure of claim 12, wherein the plate includes stainless steel.

15. The semiconductor structure of claim 10, wherein the plate includes ceramic.

16. The semiconductor structure of claim 10, wherein the adhesive includes a thermal interface material (TIM).

17. A semiconductor structure, comprising:
    a chip-on-wafer (CoW) assembly including a semiconductor substrate and a plurality of dies on the semiconductor substrate;
    a plate attached over a first side of the CoW assembly, the plate including at least one of metal and ceramic;
    an adhesive used to bonding the plate and the CoW assembly;
    another semiconductor substrate, bonded to a second side of the CoW assembly; and
    an underfill material, disposed between the CoW assembly and the another semiconductor substrate and cover at least a portion of the plate.

18. The semiconductor structure of claim 17, wherein the plate includes Cu.

19. The semiconductor structure of claim 17, wherein the plate includes stainless steel.

20. The semiconductor structure of claim 17, wherein edges of the plate are flush with edges of the CoW assembly.

* * * * *